(12) United States Patent
Bhattacharyya

(10) Patent No.: US 8,058,118 B2
(45) Date of Patent: Nov. 15, 2011

(54) METHODS OF FORMING AND OPERATING BACK-SIDE TRAP NON-VOLATILE MEMORY CELLS

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/956,570

(22) Filed: Nov. 30, 2010

(65) Prior Publication Data

US 2011/0069559 A1    Mar. 24, 2011

Related U.S. Application Data

(63) Continuation of application No. 12/177,383, filed on Jul. 22, 2008, now Pat. No. 7,851,827, which is a continuation of application No. 11/157,361, filed on Jun. 21, 2005, now Pat. No. 7,402,850.

(51) Int. Cl.
*H01L 29/74* (2006.01)

(52) U.S. Cl. ........ 438/197; 257/239; 257/314; 257/261; 365/185.01

(58) Field of Classification Search ................ 257/239, 257/261, 314; 438/197; 365/185.01
See application file for complete search history.

(56) References Cited

U.S. PATENT DOCUMENTS

| | | | |
|---|---|---|---|
| 4,776,922 A | 10/1988 | Bhattacharyya et al. |
| 4,870,470 A | 9/1989 | Bass, Jr. et al. |
| 5,751,037 A | 5/1998 | Aozasa et al. |
| 5,886,368 A | 3/1999 | Forbes et al. |
| 6,054,734 A | 4/2000 | Aozasa et al. |
| 6,514,828 B2 | 2/2003 | Ahn et al. |
| 6,534,816 B1 | 3/2003 | Caywood |
| 6,586,797 B2 | 7/2003 | Forbes et al. |
| 6,664,589 B2 | 12/2003 | Forbes et al. |

(Continued)

FOREIGN PATENT DOCUMENTS

DE    2152225    5/1972

OTHER PUBLICATIONS

M. Kwan Cho et al., High Performance SONOS Memory Cells Free of Drain Turn-On and Over-Erase: Compatibility Issue with Current Flash Technology, IEEE Electron Device Letters, vol. 21, No. 8, Aug. 2000, pp. 399-401.

(Continued)

*Primary Examiner* — Bradley K Smith
*Assistant Examiner* — Jami M Valentine
(74) *Attorney, Agent, or Firm* — Leffert Jay & Polglaze, P.A.

(57) ABSTRACT

Methods of forming and operating a back-side trap non-volatile memory cell. Method of forming a back-side trap non-volatile memory cell include forming a trapping material, forming two or more sub-layers of dielectric material on the trapping material, wherein a conduction band offset of each sub-layer of dielectric material is less than the conduction band offset of the material upon which it is formed, and forming a channel region on the two or more sub-layers of dielectric material. Methods of operating a back-side trap non-volatile memory cell include programming the memory cell via direct tunneling of carriers through an asymmetric band-gap tunnel insulator layer having two or more sub-layers formed beneath a channel region and having layers of material of increasing conduction band offset, and trapping the carriers in a trapping layer formed under the tunnel insulator layer.

22 Claims, 5 Drawing Sheets

U.S. PATENT DOCUMENTS

| | | | |
|---|---|---|---|
| 6,713,810 | B1 | 3/2004 | Bhattacharyya |
| 6,743,681 | B2 | 6/2004 | Bhattacharyya |
| 6,754,108 | B2 | 6/2004 | Forbes |
| 6,759,712 | B2 | 7/2004 | Bhattacharyya |
| 6,768,156 | B1 | 7/2004 | Bhattacharyya |
| 6,778,441 | B2 | 8/2004 | Forbes et al. |
| 6,784,480 | B2 | 8/2004 | Bhattacharyya |
| 6,849,464 | B2 | 2/2005 | Drewes |
| 6,864,139 | B2 | 3/2005 | Forbes |
| 6,900,455 | B2 | 5/2005 | Drewes |
| 6,903,969 | B2 | 6/2005 | Bhattacharyya |
| 6,917,078 | B2 | 7/2005 | Bhattacharyya |
| 6,933,572 | B2 | 8/2005 | Bhattacharyya |
| 7,279,740 | B2 | 10/2007 | Bhattacharyya et al. |
| 7,612,403 | B2 | 11/2009 | Bhattacharyya |
| 7,829,938 | B2 | 11/2010 | Bhattacharyya |
| 2002/0076850 | A1 | 6/2002 | Sadd et al. |
| 2002/0140023 | A1 | 10/2002 | Ohba et al. |
| 2002/0190311 | A1 | 12/2002 | Blomme et al. |
| 2003/0033573 | A1 | 2/2003 | Tamura et al. |
| 2003/0042527 | A1 | 3/2003 | Forbes et al. |
| 2003/0042532 | A1 | 3/2003 | Forbes |
| 2003/0042534 | A1 | 3/2003 | Bhattacharyya |
| 2003/0043632 | A1 | 3/2003 | Forbes |
| 2003/0043633 | A1 | 3/2003 | Forbes et al. |
| 2003/0043637 | A1 | 3/2003 | Forbes et al. |
| 2003/0045082 | A1 | 3/2003 | Eldridge et al. |
| 2003/0048666 | A1 | 3/2003 | Eldridge et al. |
| 2003/0049900 | A1 | 3/2003 | Forbes et al. |
| 2003/0089942 | A1 | 5/2003 | Bhattacharyya |
| 2003/0151948 | A1 | 8/2003 | Bhattacharyya |
| 2004/0041206 | A1 | 3/2004 | Bhattacharyya |
| 2004/0123085 | A1 | 6/2004 | Oikawa et al. |
| 2004/0183122 | A1 | 9/2004 | Mine et al. |
| 2004/0251489 | A1 | 12/2004 | Jeon et al. |
| 2005/0001232 | A1 | 1/2005 | Bhattacharyya |
| 2005/0167734 | A1* | 8/2005 | She et al. .............. 257/321 |
| 2006/0261401 | A1 | 11/2006 | Bhattacharyya |
| 2006/0284236 | A1 | 12/2006 | Bhattacharyya |
| 2007/0012988 | A1 | 1/2007 | Bhattacharyya |

OTHER PUBLICATIONS

F. Ito et al., A Novel MNOS Technology Using Gate Hole Injection in Erase Operation for Embeded Nonvolatile Memory Applications, VLSI Technology Digest of Technical Papers, 2004, pp. 80-81.

M. Fukuda et al., Scaled 2 bit/cell SONOS Type Nonvolatile Memory Technology for sub-90nm Embedded Application using SiN Sidewall Trapping Structure, IEDM, 2003, pp. 37.5.1-37.5.4.

C.C. Yeh et al., Novel Operation Schemes to Improve Device Reliability in a Localized Trapping Storage SONOS-type Flash Memory, IEDM, 2003, pp. 7.5.1-7.5.4.

K.W. Guarini et al., Low voltage scalable nanocrystal Flash memory fabricated by templated self assembly, IEDM, 2003, pp. 22.2.1-22.2.4.

S.J. Baik et al., High Speed and Nonvolatile Si Nanocrystal Memory for Scaled Flash Technology using Highly Field-Sensitive Tunnel Barrier, IEDM, 2003, pp. 22.3.1-22.3.4.

H. Silva et al., Few Electron Memories: Finding the Compromise between Performance, Variability and Manufacturability at the Nano-Scale, IEDM, 2003, pp. 10.5.1-10.5.4.

R. Ranica et al., A new 40nm SONos structure based on backside trapping for nanoscale memories, VLSF, 2004, pp. 99-100.

C. Lee et al., A Novel SONOS Structure of $SiO_2/SiN/Al_2O_3$ with TaN metal gate for multi-giga bit flash memeries, 2003, IEDM, pp. 26.5.1-26.5.4.

P. Blomme et al., Data retention of floating gate Flash memory with $SiO_2$/high-k tunnel or interpoly dielectric stack, 2004, Infineon Technologies.

J. Buckley et al., Engineering of "Conduction Band-Crested Barriers" or "Dielectric Constant Crested Barriers" in view of their application to floating-gate non-volatile memory devices, 2004, VKSU, pp. 55-56.

C. Lee et al., Operational and Reliability Comparison of Discrete-Storage Nonvolatile Memories: Advantages of Single-and Double-Layer Metal Nanocrystals, 2003, IEDM, pp. 22.6.1-22.6.4.

M. Takata et al., New Non-volatile Memory with Extremely High Density Metal Nano-Dots, 2003, IEDM, pp. 22.5.1-22.5.4.

Cheng-Yuan Hsu et al.; *Split-Gate NAND Flash Memory at 120nm Technology Node Featuring Fast Programming and Erase*; 2004 Symposium on VLSI Technology Digest of Technical Papers; pp. 78-79.

D. Lee et al.; *Vertical floating-gate $4.5F^2$ Split-gate NOR Flash Memory at 110nm Node*; 2004; 2004 Symposium on VLSI Technology Digest of Technical Papers; pp. 72-73.

Non-Final Office Action dated Nov. 21, 2007, U.S. Appl. No. 11/131,006 (9 pgs.)

Non-Final Office Action dated Feb. 3, 2011, U.S. Appl. No. 12/247,608 (6 pgs.)

Non-Final Office Action dated Apr. 24, 2008, U.S. Appl. No. 11/181,345 (21 pgs.)

Final Office Action dated Dec. 8, 2008, U.S. Appl. No. 11/181,345 (19 pgs.)

Non-Final Office Action dated Apr. 29, 2009, U.S. Appl. No. 11/181,345 (19 pgs.)

Final Office Action dated Dec. 2, 2009, U.S. Appl. No. 11/181,345 (20 pgs.)

* cited by examiner

METHODS OF FORMING AND OPERATING BACK-SIDE TRAP NON-VOLATILE MEMORY CELLS

RELATED APPLICATION

This application is a continuation of U.S. patent application Ser. No. 12/177,383, titled "BACK-SIDE TRAPPED NON-VOLATILE MEMORY DEVICE," filed Jul. 22, 2008 now U.S. Pat. No. 7,851,827 (Allowed), which is a continuation of U.S. patent application Ser. No. 11/157,361, titled "BACK-SIDE TRAPPED NON-VOLATILE MEMORY DEVICE," filed Jun. 21, 2005, now U.S. Pat. No. 7,402,850, each of which is commonly assigned and incorporated herein by reference.

TECHNICAL FIELD

The present invention relates generally to integrated circuits and in particular the present invention relates to non-volatile memory devices.

BACKGROUND

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM functions as a read and write memory; that is, you can both write data into RAM and read data from RAM. This is in contrast to read-only memory (ROM), which permits you only to read data. Most RAM is volatile, which means that it requires a steady flow of electricity to maintain its contents. As soon as the power is turned off, whatever data was in RAM is lost.

Computers almost always contain a small amount of ROM that holds instructions for starting up the computer. Unlike RAM, ROM cannot be written to. An EEPROM (electrically erasable programmable read-only memory) is a special type non-volatile ROM that can be erased by exposing it to an electrical charge. EEPROM comprise a memory array which includes a large number of memory cells having electrically isolated gates. Data is stored in the memory cells in the form of charge on the floating gates or floating nodes associated with the gates. Each of the cells within an EEPROM memory array can be electrically programmed in a random basis by charging the floating node. The charge can also be randomly removed from the floating node by an erase operation. Charge is transported to or removed from the individual floating nodes by specialized programming and erase operations, respectively.

Yet another type of non-volatile memory is a Flash memory. A Flash memory is a type of EEPROM that is typically erased and reprogrammed in blocks instead of a single bit or one byte (8 or 9 bits) at a time. A typical Flash memory comprises a memory array, which includes a large number of memory cells. Each of the memory cells includes a floating gate field-effect transistor (FET) capable of holding a charge. The data in a cell is determined by the presence or absence of the charge in the floating gate/charge trapping layer. The cells are usually grouped into sections called "erase blocks." Each of the cells within an erase block can be electrically programmed in a random basis by charging the floating gate. The charge can be removed from the floating gate by a block erase operation, wherein all floating gate memory cells in the erase block are erased in a single operation.

The memory cells of both an EEPROM memory array and a Flash memory array are typically arranged into either a "NOR" architecture (each cell directly coupled to a bit line) or a "NAND" architecture (cells coupled into "strings" of cells, such that each cell is coupled indirectly to a bit line and requires activating the other cells of the string for access).

Floating gate memory cells are typically programmed by injecting electrons to the floating gate by channel hot carrier injection (CHE), typically placing the cell in a high threshold voltage state. Floating gate memory cells can also be erased by hot hole injection from the substrate. Alternatively, floating gate memory cells can be programmed and erased by electron tunneling to and from the substrate by Fowler-Nordheim tunneling to put the cell in a programmed or erased threshold state. Both mechanisms require the generation of high positive and negative voltages in the memory device and can place high fields across the gate insulation layers with resulting adverse effects in device characteristics and reliability.

A problem with CHE, hot hole injection and Fowler-Nordheim tunneling is that the high energy required for their operation damages the oxide interfacing silicon substrate, reducing memory cell retention, endurance, and degrading transconductance of the FET. In particular, the tunnel insulation layer, which is placed between the channel and the floating node/charge trapping layer is typically damaged by the programming process by having hot carriers injected or tunneled through it. As high control fields are also typically asserted on the channel during writing and erasing through the tunnel insulation layer by the application of voltage to the control gate of the memory cell, damage to the tunnel insulator by the hot carrier injection or high fluence tunneling process can significantly affect device characteristics. Hot carrier injection can generate interface states, degrade device transconductance, and enhance device leakage via enhanced short channel effect, besides affecting charge retention and read-disturb. Hot hole injection can generate fixed charge trapping centers in the tunneling insulators and associated defects in the trapping layer, thus breaking stable bonds and eventually degrading the insulator/dielectric properties of the device. For a conventional Flash or SONOS non-volatile memory device, the same control gate is also used during a read operation as a FET to read the state of the memory cell. When the tunnel insulator (also known as the tunnel oxide) is degraded, the read characteristics of the memory cell are also degraded due to the transconductance degradation and enhanced leakage. This affects the read speed of the memory cell.

An additional problem in Flash and SONOS memory cell arrays is that voltage scalability affects the minimum cell size, and consequently the overall memory density of any resulting array. As integrated circuit processing techniques improve, manufacturers try to reduce the feature sizes of the devices produced and thus increase the density of the IC circuits and memory arrays. In modern IC circuits and memory arrays, as SONOS transistors and floating gate memory cells are scaled to smaller feature sizes, the device characteristics of the component transistors and floating gate memory cells can alter and leave the resulting IC or memory device non-functional. These issues include, but are not limited to, short channel effect, signal cross-talk, device programming and operating voltages, reduced logic windows, oxide punch-through, and charge leakage and retention.

For the reasons stated above, and for other reasons stated below which will become apparent to those skilled in the art upon reading and understanding the present specification, there is a need in the art for methods and apparatus for a non-volatile memory cell that allows for feature and voltage scaling, prevents read degradation while providing enhanced retention, speed, endurance, and exhibits increased device integrity.

DETAILED DESCRIPTION

Figure 1A:
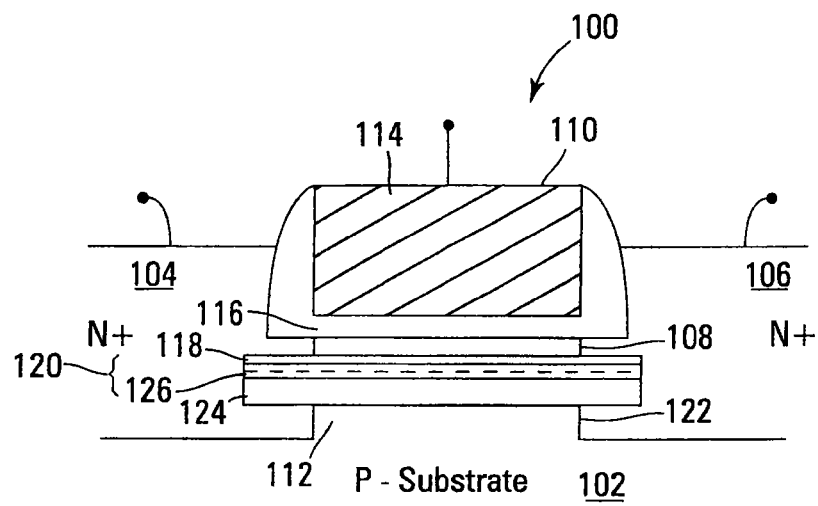
FIGS. 1A-1E detail bulk and SOI back-side trap memory cells and band diagram in accordance with embodiments of the present invention.

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The terms wafer and substrate used previously and in the following description include any base semiconductor structure. Both are to be understood as including bulk substrate, silicon-on-sapphire (SOS) technology, silicon-on-insulator (SOI) technology, silicon-on-nothing (SON) technology, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the claims and equivalents thereof.

Non-volatile memory devices and arrays, in accordance with embodiments of the present invention, facilitate the utilization of back-side trapped floating node memory cells with band-gap engineered gate and gate-insulator stacks with asymmetric tunnel barriers. Embodiments of the present invention allow a separate front gate-insulator stack for reading and a separated back gate for programming (write and erase) and a back-side gate-insulator stack for charge storage. Additionally, the embodiments of the present invention allow implementation of the non-volatile memory device on bulk silicon and SOI or SON substrates with thick and thin channel regions/floating bodies formed between the front and back-side gate-insulator stacks (also known as the top or bottom gate-insulator stacks). Embodiments of the present invention further allow for direct tunnel programming and efficient erase with electrons and holes in back-side trap memory cells, while maintaining high charge blocking barriers and deep carrier trapping sites for good charge retention and reduces the possibility of damage to the channel/insulator interface. The direct tunneling program and efficient erase capability reduces damage to the back gate-insulator stack and the crystal lattice from high energy carriers, reducing write fatigue and leakage issues and enhancing device lifespan. Utilizing the separate front side gate for reading the back-side trap memory cells also enable further scaling of device features with improved lithography through increased logic window, decreased susceptibility to short channel effect, and increased operational speed. Memory device embodiments of the present invention are presented that are arranged in NOR or NAND memory architecture arrays. Memory cell embodiments of the present invention also allow multiple levels of bit storage in a single memory cell, and allow for programming and erase with reduced voltages, enhancing endurance and reducing power.

In back-side trap non-volatile memory cell FETs, source and drain regions are formed and are separated by a thin or thick body channel region with a first gate stack (also known as the front gate stack, top gate stack, or access gate stack) formed over the channel region and/or portions of the source and drain regions. The top gate stack comprises a layer of trap-free insulation and a control gate (the access gate) forming a FET device which allows for the formation of minority carriers in the channel and control of the carrier flow from the source to the drain through the channel via the voltage applied to the access gate. This top gate FET is typically used exclusively for sensing (reading) the state of the memory cell. A second gate-insulator stack (known as the back-side gate stack, bottom gate stack, or trapping layer gate stack) is formed beneath the channel region and is employed for charge storage and programming (writing and erasing). This device element typically comprises successive layers of tunnel insulation, a floating node trapping layer (or, alternatively, a conductive floating gate), a charge blocking insulation layer and a back-side control gate. This second gate stack, with its electrically isolated trapping layer, allows charge to be trapped beneath the channel region and affect the threshold voltage level of the sensing part (top gate FET) of the memory cell. The back-side control gate can be formed of aluminum, tungsten, polysilicon or other conductor material and be independently coupled to a control line or, as is in the case of an SOI or bulk implementation, be formed from the substrate. Such back-side trap non-volatile memory cell FETs are also referred to as a vertically integrated "dual gate transistor non-volatile memory devices."

Conventional SONOS memory cell devices typically employ successive layers of oxide/nitride/oxide (ONO) as the insulator stack between the silicon substrate and the heavily doped polysilicon control gate (or metal gate). The oxide adjacent to the silicon substrate is usually thinner and acts as a tunnel insulation layer (also known as a tunnel oxide) while the thicker oxide adjacent to the control gate acts as the charge blocking oxide. Trapped charges stored in the device are typically held at the tunnel oxide-nitride interface and at the bulk trapping centers in the nitride layer. The equivalent oxide thickness (EOT) of the SONOS memory cell gate-insulator stack typically determines the program and erase voltage levels of the device. The program/erase speed, and especially, the erase speed and charge retention are strongly influenced by the tunnel oxide thickness. The logic window between the logic "1" and the logic "0" memory states (Vt"1"-Vt"0") is generally dependent on the trapped charge density at the interface and in the bulk of the nitride and consequently increases with increasing thickness of the nitride. Due to the high field requirements of the charge transport through the tunnel oxide and the relatively low density of deep energy traps in the nitride, the a) voltage scalability, b) program/erase speed, and c) magnitude of the logic window are generally limited with the SONOS device ONO insulator stack when an industry standard minimum of ten years of charge retention is required. This is especially true if programming voltage levels are to be scaled.

Regardless of the mechanisms of charge transport employed (CHE, Hot Hole, or Fowler-Nordheim Tunneling), Floating gate memory cells are even more limited in voltage scalability and speed compared to SONOS. This is due to the fact that the EOT of such device gate-insulator stacks are required to be nearly twice that of a SONOS device and the tunnel oxide thickness is two to four times as thick when compared to those of the SONOS device to be able to ensure ten years of charge retention. Floating gate Flash devices typically employ oxide as the tunnel layer media and a thicker ONO stack on top of the polysilicon floating gate as the charge blocking layer.

For a single transistor memory cell of either Floating gate type or SONOS type, the control gate acts as both the "read" or "addressing" gate and the gate that controls the operation of programming and erase. During "read" operation, conductance of the memory cell FET determines the read speed of the device, which in turn typically depends on the transconductance and channel width/length (W/L) ratio of the device. During the standby state, device leakage depends on short channel effects and the stability of the memory states. High voltage requirements and hot carrier induced degradation of tunnel oxide adversely affect read speed and read disturb, as well as device leakage, as mentioned above.

As the channel length in conventional field effect transistors and floating gate/node memory cells are reduced in length, the devices begin to be adversely affected by what has been called the short channel length effect. With the short channel length effect, as the channel is reduced in length, the distance between the source and drain regions is decreased and the impurity diffusions that form the source and drain regions begin to merge under the device in the channel region. This has the effect of changing the device into a depletion mode device, where a channel of minority carriers is already formed in the channel region under the device and the device conducts current without the application of a voltage on the control gate. This leakage current through unselected devices can corrupt data reads on the common bitlines unless the device is isolated or driven with a voltage to force it to turn off. Eventually the short channel effect, with shorter and shorter channels, can progress to the point where the device cannot be shut off, destroying the ability of the control gate to modulate the conductance of the device (it acts more and more as a resistor) and destroying it as a non-linear device. The short channel effect is typically not seen in dual gated transistors and back-side trap memory cell FETs, due to the thin channel body of the device and incident top and bottom fields.

As stated above, both the high voltage requirements and higher leakage currents associated with the programming (write/erase) of the current generation of flash technology have begun to adversely affect endurance, reliability, power and speed of operation of the resulting devices and limit scalability. The high programming and erase voltages apply high fields across the gate insulator stack typically cause gate insulator oxide degradation. This gate insulator oxide degradation impacts device non-volatility (charge retention) and limits the overall device endurance (the number of program/erase cycles possible before failure). The high fields also severely limit the amount the device feature geometry can shrink beyond the current generation due to insulation and design requirements. The high programming voltages are also known to induce a strong capacitive cross-coupling between a selected bit and adjacent unselected bits with the same wordline (or bitline) or between adjacent wordlines or bitlines. This cross-coupling has become a critical issue in the overall memory device speed and scaling. Cross-coupling issues typically increase as voltage levels are increased or as the memory device features are scaled smaller without there being a commensurate reduction in voltage levels.

As stated above, typical SONOS floating node memory cell devices, unlike floating gate devices, hold charges in discrete traps associated with a nitride trapping layer. The equivalent EOT of the central ONO insulator stack for such devices can be as low as about half that of floating gate device and, therefore, the programming voltage level for a SONOS device is about half of that of an equivalent floating gate device. However, further voltage and feature scaling for SONOS devices are limited without it adversely affecting charge retention (due to leakage and back-tunneling) and speed (which is typically tunnel oxide thickness dependent) and logic window (which is typically nitride trapping layer thickness dependent). Even though SONOS devices may operate by tunneling for both write and erase, the peak field across the tunnel oxide can still be very high (typically 10 MV/cm) causing the associated high field degradation of the tunnel oxide, adversely affecting endurance and reliability.

Because of the above stated reasons, oxide-based non-volatile memory cell devices, such as traditional Flash, SONOS, or Nano-crystal memory cells are limited in voltage, power, speed, and feature scalability. Additionally, because of the high fields required across the oxide insulation layers, such oxide-based devices are also limited in reliability and endurance.

Dual gate and Back-side trap devices, because of their structure, sandwich a (typically thin) body region between two gate stacks (the top and bottom gate stacks). This thin body transistor structure prevents short channel effect by limiting the channel body thickness and the available body charge. In addition, dual gate devices have been utilized in fast logic devices because of their improved channel conductance (due to twin minority channel carrier regions being formed at both the top and bottom of the channel body) and reduced capacitance thereby enhancing switching characteristics. As a result of these properties, dual gate and back-side trap devices can typically be scaled further while exhibiting better performance characteristics than single gate devices.

Back-side trap memory cell embodiments of the present invention utilize band-gap engineered gate-stacks that allow low voltage program and erase of the memory cells via the direct tunneling of carriers to or from the trapping layer held below the channel in the bottom gate stack. The band-gap engineered bottom gate stack of embodiments of the present invention incorporate tunnel insulator layers having asymmetric tunnel barriers and one or more layers of direct tunnel insulator layers of increasing conduction band offset (each following tunnel layer has a higher conduction band energy level than the previous layer) and increasing values of K (dielectric constant) to provide very high electron current density during programming at reduced voltage drop across the direct tunnel layers. The combination of deep charge trapping centers and asymmetric tunnel barriers of increasing band offset provides large reverse tunneling barrier to promote the required charge retention. In embodiments of the present invention, appropriate selections of charge trapping material and embedded nanocrystals facilitate a desired Vt shift for minimum adequate logical state/logical window separation. In addition, in embodiments of the present invention, the dielectric constant values of the gate stack layers help minimize the EOT of the gate insulator stack. This enables a gate stack EOT in the range of 2 nm to 6 nm to allow for low voltage operation and speed. Such methods of direct tunnel programming and erasure utilizing band-gap engineered asymmetric tunnel layers are detailed in U.S. patent application Ser. No. 11/131,006, titled "A NOVEL LOW POWER NON-VOLATILE MEMORY AND GATE STACK," filed May 17, 2005, now issues as U.S. Pat. No. 7,612,403, and U.S. patent application Ser. No. 11/127,618, titled "BAND-ENGINEERED MULTI-GATED NON-VOLATILE MEMORY DEVICE WITH ENHANCED ATTRIBUTES", filed May 12, 2005, now issued as U.S. Pat. No. 7,279,740, both of which are commonly assigned.

As stated above, in direct tunneling of carriers, the carriers are quantum mechanically tunneled into the trapping layer under low energy conditions. To overcome limitations of reverse direct tunneling operation, the gate-stack of the embodiments of the present invention utilizes one or more layers of material that are band-gap engineered with increasing band-gap offsets and high K values to form an asymmetric band-gap tunnel insulator layer. This asymmetric band-gap tunnel insulator layer is very efficient in charge transport in one direction and yet becomes very retarded in the reverse transport direction, presenting a large barrier. The asymmetric band-gap tunnel insulator layer allows for a low voltage direct tunneling to the trapping layer of the device when a programming field is applied across it utilizing the stepped internal fields of the one or more band-gaps of the asymmetric band-gap tunnel insulator layers, while the same stepped band-gap offsets and high K dielectrics present a large band-gap and consequently large energy barrier to the charges so trapped to prevent back-tunneling and maintain the required long term charge retention.

Because of this direct tunneling programming and erasure, embodiments of the present invention provide a non-volatile memory cell having an insulator stack with a low overall EOT, allowing them to be operated at very low power and at low programming voltage. The low voltage program and/or erase operations of embodiments of the present invention also reduce damage in the material of the device due to the tunneling/injection of carriers through the insulator layers (the injected carriers are "cool" and never gain enough energy to affect the lattice or material bonds). In addition, embodiments of the present invention allow for improved scaling by allowing the memory to employ smaller effective oxide thicknesses (EOT) and low voltage layout and design in the array and support circuitry of the resulting memory device. The band-gap engineered tunneling medium of embodiments of the present invention consists of one or more layers of direct tunnel layers of increasing conduction band offset and increasing values of K (dielectric constant) to provide very high electron current density during programming at reduced voltage drop across the direct tunnel layers, allowing for high speed, low power programming.

For a back-side trap memory cell, the charge blocking layer and tunnel layer placement are positioned in the bottom gate-insulator stack such that the tunnel insulator is positioned below the channel body and located between it and the floating node/trapping layer, and the charge blocking layer is between the back-side gate/substrate and the trapping layer. In this arrangement, charge transport takes place primarily between the channel and the trapping layer (floating node) of the bottom gate stack during programming and erasure. In programming operation, the stepped band-gap arrangement facilitates direct tunneling of electrons layer to layer from the channel to the trapping layer with a low applied field. After tunneling to the trapping layer, the combined asymmetric stepped energy barriers, long back tunnel distance, and optional deep level charge traps act to reduce charge leakage to the substrate and provide adequate charge retention for non-volatile usage. A high K charge blocking layer is also integrated in the bottom gate-stack between the trapping layer and the back-side gate/substrate for one embodiment of the present invention to maintain low charge leakage to the back-side gate/substrate from the trapping layer.

In another embodiment of the present invention, nano-crystals are embedded in a trapping layer which contains deep high density traps to provide a large trapped charge density, enhancing logic level separation and increasing stored charge, while minimizing the adverse effects of coulomb blockade and quantum confinement. The use of deep traps and/or nano-crystals further increase charge retention by providing deep quantum wells at the trapping layer, further increasing the potential barrier that the trapped charges must overcome to escape from the trapping layer or back-tunnel through.

During read operations, the front/access gate is active and asserts a field to generate a channel of minority carriers in the channel body region, operating the top gate stack as a conventional FET. The bottom gate stack is inactive during reads, aside from the field asserted by the charge trapped on the trapping layer on carriers in the channel.

Programming the back-side trap memory cell embodiments of the present invention is accomplished by providing a voltage across the channel to the back-side gate/substrate to apply a field across the one or more tunnel layers and induce direct tunneling of electrons from the channel to the trapping layer of the bottom gate stack.

In multi-bit memory cell programming, multiple data bits are encoded into a memory cell usually via either multiple charge centroids stored in the trapping layer or by modulating the threshold voltage level to encode the stored data bits. In threshold voltage modulated multi-bit storage, also known as multi-level cell (MLC) storage, differing threshold voltage levels are utilized to encode the data values stored in the memory cell, thus making a large logic window separation in the memory cell advantageous. The memory cell is then read by sensing the threshold voltage the memory cell activates at. In charge centroid multi-bit storage, the voltage is applied between a selected source/drain region (with back-side trap memory cell operating with the selected source/drain region acting as a source and the second source/drain region acting as the drain) and the back-side gate/substrate, tunneling electrons to the trapping layer directly adjacent to the selected source/drain region. The memory cell is then read utilizing the access gate and top gate stack by reversing the operational function of the first and second source/drain regions (the selected source/drain region acting as the drain and the second source/drain region acting as the source).

Erasure in back-side trap memory cell embodiments of the present invention is also accomplished by direct tunneling of holes and by enhanced Fowler-Nordheim tunneling of electrons from the trapping sites. A voltage is applied across the tunnel layers from the back-side gate/substrate to the channel, applying a field across the one or more tunnel layers and inducing direct tunneling of holes from the channel body and Fowler-Nordheim tunneling of electrons from the trapping layer of the bottom gate-stack to erase the memory cell. The erasure operation is relatively slower than the corresponding direct tunnel program operation, due to the asymmetric tunnel barrier and/or the higher effective mass of holes. The relatively slower erase, however, can be offset by utilization of a block erase operation, where a large block of bits is erased in parallel.

It is noted that the erase speed of the back-side trap memory cell erasure of embodiments of the present invention can also be accomplished by or enhanced by a combination of conventional hot-hole injection, enhanced Fowler-Nordheim electron tunneling, or by enhanced Fowler-Nordheim tunneling of holes from the back-side gate/substrate.

It is also noted that the appropriate selection of back-side gate/substrate passivation layers as well as band engineered tunnel layers can be utilized to enhance erase speed through simultaneous hole injection from the back-side gate/substrate during erase operation. Such method of memory cell erasure through hole injection is detailed in U.S. patent application Ser. No. 11/127,618, titled "BAND-ENGINEERED MULTI-GATED NON-VOLATILE MEMORY DEVICE WITH ENHANCED ATTRIBUTES", filed May 12, 2005, now issued as U.S. Pat. No. 7,279,740, and U.S. Pat. No. 6,784,480, titled "ASYMMETRIC BAND-GAP ENGINEERED NONVOLATILE MEMORY DEVICE," issued Aug. 31, 2004, both of which are commonly assigned.

This programming and erasure by the transport of electrons and holes by direct tunneling allows embodiments of the present invention to consume orders of magnitude lower power compared to conventional flash memory cells and devices. Writing and erase speed are significantly enhanced as electrons and holes tunnel directly from one direct tunnel layer into the next through successive layers of low barrier energy.

As stated above, the tunnel insulation layer region of embodiments of the present invention may consist of one or more layers of dielectric material with increasing conduction band offsets and/or increasing dielectric K values, allowing directionally asymmetric direct tunneling efficiency of carriers through the tunnel layer. The layers of dielectric material can be selected from any commonly utilized insulator materials (oxides, mixed oxides, nitrides, oxynitrides, mixed oxynitrides, or silicates) so long as they are arranged in increasing band-gap offsets and, preferably, higher K dielectric materials to help reduce the EOT of the resulting memory cell. Examples of these insulator materials include, but are not limited to, silicon dioxide ($SiO_2$), titanium dioxide ($TiO_2$), hafnium oxide ($HfO_2$), zirconium oxide, Praseodymium Oxide ($Pr_2O_3$), alumina ($Al_2O_3$), mixed oxide hafnium and aluminum, mixed oxide of hafnium and titanium, mixed oxide of hafnium and silicon, silicon oxynitride (SiON), SiN, AlN, HfN, mixed oxynitrides of hafnium and silicon, etc. These layers of increasing band-gap offset dielectric material are typically deposited during manufacturing processing utilizing atomic layer deposition (ALD) or other appropriate deposition processes.

For example, the tunnel layer region may be a composite of one or more mono layers of $SiO_2$ (band gap 9 eV, K=3.9), formed under the channel region, followed by one or more mono-layers of silicon nitride (SiN, band offset 1.03 eV, K=7) or alumina ($Al_2O_3$, band offset: 4.5 eV, K=10) to be followed by a one or more mono-layers of $HfO_2$ (band offset: 1.65 eV, K=24) or $Pr_2O_3$ (band offset: 1.9 eV; band gap 3.9 eV; K=30) or $TiO_2$ (band offset 3.15 eV; K=60) for a three layer tunnel layer structure. A two-layer tunnel structure can consist of $SiO_2/Pr_2O_3$ or $SiO_2/TiO_2$, $SiO_2/HfO_2$, etc. It is noted that other two, three, or more layer asymmetric band-gap tunnel regions of embodiments of the present invention are also possible and will be apparent to those skilled in the art with the benefit of the present disclosure, and as such the above examples should not be considered as limiting.

It is also noted that, in one embodiment of the present invention, the successive layers of the asymmetric band-gap tunnel layer not only have increasing band offsets, but also have material of higher K values and increased direct tunnel thickness to minimize the effective EOT of the tunnel layer composite and optimize voltage drop across the each of the tunnel layers. In embodiments of the present invention, the physical thickness of the composite tunnel layer can be preferably designed to be around 3 nm or less and the EOT around 1.5 nm or less for low voltage operation. For example, a typical tunnel layer may consist of 0.8 nm of $SiO_2$+1 nm of SiN+1 nm of $HfO_2$ (EOT=1.6 nm) or 0.8 nm of $SiO_2$+1 nm of $HfO_2$+1.5 nm of $Pr_2O_3$ (EOT=1.3 nm) or 0.8 nm of $SiO_2$+1 nm of $HfO_2$+2 nm of $TiO_2$ (EOT=~1.2 nm).

In order to improve retention and charge density, metal nano-crystal memory devices have been utilized that contain certain metal or semiconductor nano-dots or nano-crystals including, but not limited to, tungsten, silicon, germanium, cobalt, platinum, gold, iridium, and palladium to provide deep energy trapping sites at the metal-insulator interface due to large work function difference. However, such devices require adequate dot size and dot separation to ensure effective retention of trapped charges due to quantum confinement effect (to prevent electrons from tunneling between adjacent trapping sites within the trapping layer or tunneling back to silicon). In addition, coulomb blockade (where like charges repel each other) could further degrade charge retention, such that, in design, multiple charge trapping per nano-dot should be avoided.

If coulomb blockade is minimized such that effectively a single electron is captured for every available nano-dot trapping site and the nano-dot size and separation are optimized to reduce the adverse effects of quantum confinement, the effective charge trapping density of nano-dot trapping layer is limited to around $1E12/cm^2$ to $2E12/cm^2$ regardless of the actual density of nano-dots. Consequently, the effective charge trapping density for conventional nano-dot or nano-crystal devices is limited. This effective charge trapping density limitation can be overcome if a selected geometry and distribution of nano-crystals were embedded in insulating trapping layers that also contained a high density of naturally occurring deep traps, such as SiN, AlN, or SiON. If this trapping layer is also formed of high K material, the EOT of the entire bottom gate stack would also be reduced.

The above concept is utilized for the trapping medium in one embodiment of the invention. In this approach, the trapping medium may consist of an appropriate thickness of an insulator having a large number of naturally occurring trap sites, such as silicon oxynitride (SiON, trap depth: Et>1.2 eV, refractive index ~1.8, K=7) or $HfO_2$ (trap depth: Et=1.5 eV, K=24), silicon nitride ($Si_3N_4$, trap depth: Et=1.0 eV, refractive index=2.0, K=7), silicon-rich silicon nitride, tantalum oxide, ($Ta_2O_5$, Et=2.7 eV, K=26) aluminum nitride (AlN, trap depth>1.0 eV, K=10) or $TiO_2$ (trap depth: Et=0.9 eV; K=60). The trapping medium is then embedded with nano-crystals/nano-dots that can include, but are not limited to tungsten, silicon, germanium, cobalt, platinum, iridium, gold, or palladium in sizes ranging from 1.5 nm to 4 nm with a separation of 3.5 nm to 5 nm to further increase the number of trapping sites.

As stated above, the silicon oxy-nitride (SiON) utilized in the above example provides additional charge trapping sites. The nitrogen-rich SiON has an atomic silicon concentration of approximately 38%-40%, an atomic oxygen concentration of approximately 20%, and an atomic nitrogen concentration of approximately 40%, resulting in a trapping layer with a dielectric constant of approximately 7, refractive index of approximately $\gamma$=1.8, a band-gap of approximately 5.5 eV to 5.7 eV, and a charge trap density of 8E12-1E13/cm2, with a trap depth of approximately 1.7 eV. In the above SiON, deep energy traps are associated with larger concentrations of Si—O—N bond "defects" in the silicon oxy-nitrides. Such a trapping layer of an embodiment of the present invention would provide an effective charge density in the desired range of $5E12/cm^2$ to $1E13/cm^2$ without the adverse effects on retention due to coulomb blockade or quantum confinement. It is noted that other charge trapping insulator materials may also be utilized in embodiments of the present invention as the charge trapping layer. Such a nitrogen-rich SiON trapping layer can also be combined with a oxygen-rich silicon oxy-nitride, SiON, (refractive index of approximately $\gamma=1.55$, band-gap 7.3 eV, and K=5) tunnel layer to provide an asymmetric tunnel barrier in a single layer. The oxygen-rich silicon oxy-nitride (SiON, with refractive index of approximately $\gamma=1.55$) has an atomic oxygen concentration of $>=46\%$, while its atomic silicon concentration is $<=33\%$.

For one embodiment of the present invention, the charge blocking layers are preferably comprised of a single or composite layer of large K dielectric material layers such as $Al_2O_3$ (K=10) or $Pr_2O_3$ (K=30) or $TiO_2$ (K=60) of thickness greater than 6 nm, to provide a large electron energy barrier and prevent direct tunneling of trapped charges to the back-side gate/substrate while helping minimize the overall EOT of the bottom gate-stacks. As stated above, charge blocking layers have been disclosed that allow for erasure of the data stored in the trapped charge on the trapping layer of the memory cell by allowing the tunneling or injection of hole or electron carriers through the charge blocking layer from the back-side gate/substrate. It is noted, however, that multiple insulators can be utilized in charge blocking layers of embodiments of the present invention, including, but not limited to insulators from the oxide, mixed oxide, nitride, oxynitrides, mixed oxynitrides, and silicate families.

The access gate and back-side gate/substrate of embodiments of the present invention typically have a thin passivating conductive underlayer of HfN, TiN, $IrO_2$ or TaN (for process integration) over the gate or substrate. The access gate or back-side gate (if a separate material and not formed from the substrate) typically comprise either a polysilicon gate or any other appropriate metal gate (such as aluminum, iridium or tungsten) formed under the charge blocking layer of the bottom gate stack.

The total EOT for a gate stack of an embodiment of the present invention made with the above materials and specifications will typically range from EOT=2.5 nm to EOT=6.5 nm with physical thickness ranging (excluding the back-side gate electrode thickness) from 10 nm and upward, have a programming voltage as low as 1.5V, and an average field as low as $1.0E6V/cm^2$. This allows back-side trap memory cells and devices of embodiments of the present invention to provide voltage scalability and low power consumption levels not available in other current memory devices.

Figure 1B:
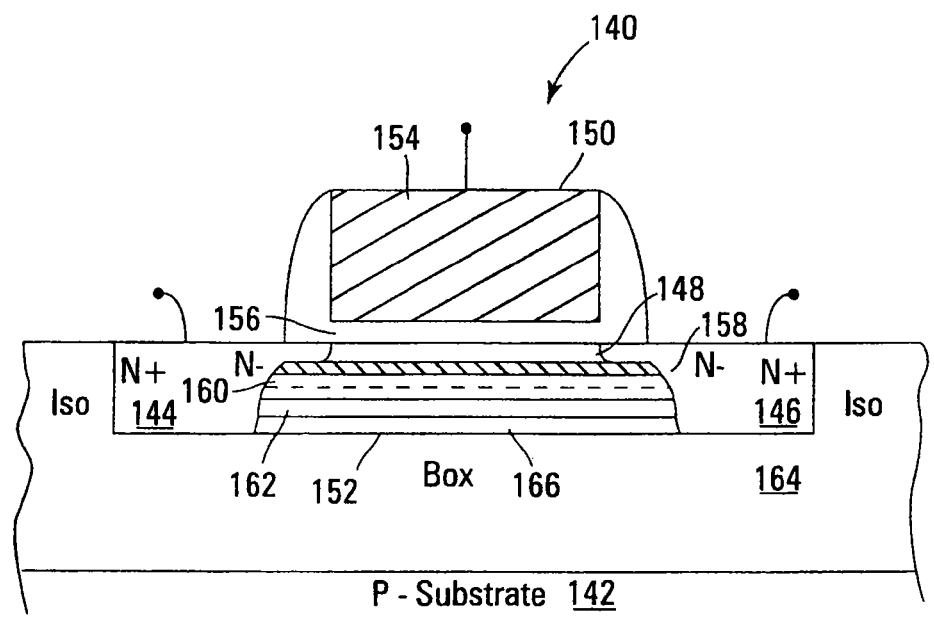
Figure 1C:
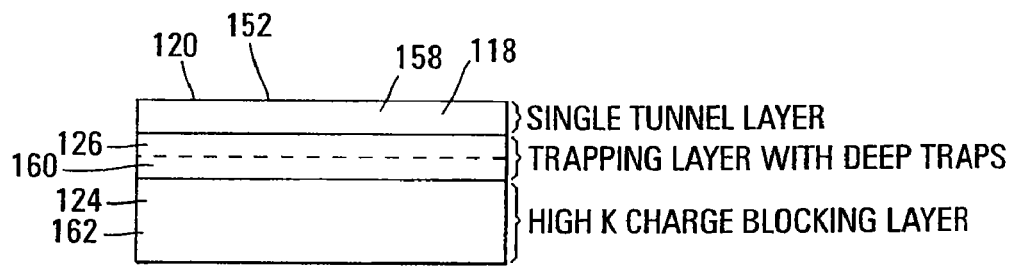
Figure 1D:
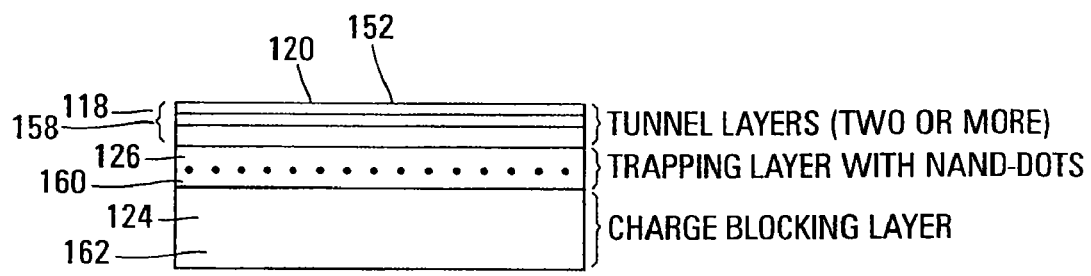
Figure 1E:
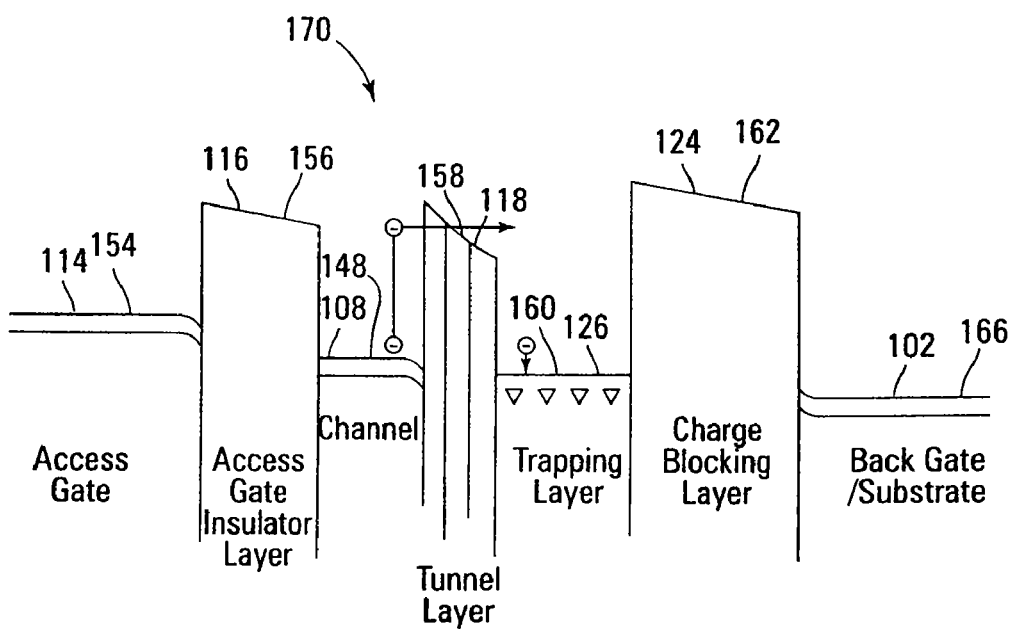

FIGS. 1A and 1B detail physical cross sections of both a bulk silicon implementation 100 and a silicon-on-insulator (SOI) implementation 140 of the back-side trap non-volatile device structures, while FIG. 1E details the corresponding band-gap diagram of a back-side trap memory cell 100, 140 in accordance with embodiments of the present invention. In FIG. 1A, a bulk back-side gate NFET memory cell 100 is shown formed on a substrate 102. The memory cell 100 has a first and second source/drain regions 104, 106, in contact with a thin or thick body channel region 108. A top gate-stack 110 is formed over the silicon body channel region 108, containing an access gate 114 isolated from the body channel 108 by a gate insulator layer 116. A bottom gate-stack 112 is formed under the channel region 108. In the bottom gate-stack 112, the back-side control gate 122 is formed as a bulk back-side control gate from the substrate 102, which may either be a bulk or silicon-on-insulator (SOI) substrate. The insulator stack 120 of the bottom gate-stack 112 contains a charge blocking layer 124 formed over the bulk back-side control gate 122, a trapping layer/floating gate 126 formed over the charge blocking layer 124, and a tunnel insulator layer 118 formed over the trapping layer 126, directly under the channel region 108. The tunnel insulator layer 118 includes one or more layers of materials layered to provide an asymmetric stepped band-gap profile. The trapping layer 126 may also be optionally provided with deep traps and embedded metal nano-crystals.

Multiple layers of single crystal semiconductor films can be deposited over bulk silicon substrate, as well as over SOI substrates. For example, a layer of appropriate thickness germanium can be deposited over a silicon substrate to be followed by another layer of epitaxially grown silicon. By a combination of lithographic patterning and selective etching of underlying germanium films, selective localized voids can be formed underneath the top silicon film. This technique was developed by M Jurezak et al. VLSI Tech. Digest p. 29, 1999, and is called silicon-on-nothing or SON. Recently R. Ranica et al. built and characterized PMOS back-side trapped SONOS memories by depositing ONO layers on SON (R. Ranica et al., IEEE Silicon nanoelectronic workshop, p. 99, 2004). The present invention applies similar techniques in bulk silicon and SOI to create novel back-side trapped non-volatile memory cells.

For another embodiment of the present invention, a back-side non-volatile memory cell comprises a first and second source/drain regions formed over the buried oxide (BOX) region of an SOI substrate. Top gate and underlying trap-free insulator is formed over the thin-body p-type silicon similar to a fully depleted SOI-NFET device. Underneath the thin floating body, an ONO replacement back gate-insulator stack and the back gate is formed between the thin body and the BOX region. The back gate may consist of heavily doped N+ or P+ polysilicon or metal, while the ONO replacement layer consists of a charge blocking layer formed over the back gate, a trapping layer formed over the charge blocking layer, and one or more sub-layers of tunnel insulator formed over the trapping layer and interfacing the thin floating body. The back gate and the insulator stack are formed in a similar manner of silicon-on-nothing (SON) implementation as outlined by the reference of R. Ranica et al. The tunnel insulator layer may consist of one or more layers of dielectric material of increasing conduction band offset. The thin body implementation, as described above, provides immunity from short channel effects and aids in further feature size reduction.

In FIG. 1B, a silicon-on-insulator (SOI) back-side gate NFET memory cell 140 is shown formed on a substrate 142 utilizing a silicon-on-nothing (SON) design. Silicon-on-nothing (SON) design forms a void 164 under the body of the device to reduce the effect of substrate parasitics on the resulting circuit element. The memory cell 140 has a first and second source/drain regions 144, 146, in contact with a floating body channel region 148. A top gate-stack 150 is formed over the channel region 148, containing an access gate 154 isolated from the channel by an insulator layer 156. A bottom gate-insulator stack 152 is formed under the floating body region 148. The bottom gate-insulator stack 152 contains a charge blocking layer 162 formed over a back-side gate 166, a trapping layer 160 formed over the charge blocking layer 162. A multi-layer asymmetric band-gap tunnel insulator layer 158 is formed over the trapping layer 160, directly under the channel region 148. The tunnel insulator layer 158 includes two or more layers of materials layered to provide an asymmetric stepped band-gap profile. The trapping layer 160 may also be optionally provided with deep traps and embedded metal nano-crystals.

FIG. 1C illustrates an example of an ONO replacement gate-insulator stack for the bottom gate-insulator stack 120, 152 of an embodiment of the present invention. A single oxygen-rich silicon oxynitride 118, 158 (>46 atomic percent oxygen, 20 atomic percent nitrogen, refractive index $\gamma=1.55$, K=5) replaces the tunnel oxide with a barrier height of 2.8 eV, compared to 3.2 eV for $SiO_2$, thereby enhancing direct tunnel electron fluence during programming. The trapping dielectric 126, 160 is a layer of nitrogen-rich silicon oxynitride (approximately 40 atomic percent nitrogen, 20 atomic percent oxygen, refractive index of approximately $\gamma=1.8$, K=7) which provides higher density (approximately $1E13/cm^2$) deeper traps (trap depth of approximately 1.7 eV compared to a nitride trap depth of approximately 1 eV). The charge blocking layer is replaced by alumina ($Al_2O_3$) 124, 162 which has barriers comparable to $SiO_2$ to electrons and holes and at the same time a K value of approximately 10 compared to $SiO_2$ (K~=3.9), thereby reducing the overall EOT of the resulting gate-insulator stack. The tunnel oxygen-rich oxynitride ($\gamma=1.55$) has the characteristic of very low trap density similar to $SiO_2$ and yet has a significantly lower leakage compared to $SiO_2$ thereby providing improved retention compared to an equivalent ONO gate-insulator stack, the above stack would reduce the EOT by two-thirds (⅔×) and consequently reduce write/erase voltage levels while improving speed, retention and endurance.

FIG. 1D illustrates the details of a relatively more complex example of a bottom gate-insulator stack 120, 152 of an embodiment of the present invention containing tunnel dielectric medium 118, 158, a more complex trapping medium 126, 160, and a high-K charge blocking medium 124, 162. The tunnel media 118, 158 consists of two or more layers of dielectric of increasing conduction band offset and high K values, enabling direct tunnel "barrier thinning" (a shorter effective tunnel distance when field is imposed across the tunnel insulator layer) thereby promoting significantly enhanced electron transport across the layers at reduced fields. The trapping media 126, 160 consists of a high K dielectric layer of intrinsic deep traps of high trap density, aided by enhanced trapping due to embedded high work function nano-dots. The high K charge blocking layer 124, 162 is alumina ($Al_2O_3$) 124, 162 which has barriers comparable to $SiO_2$ to electrons and holes and at the same time a K value of approximately 10 compared to $SiO_2$ (K~=3.9), thereby reducing the overall EOT of the resulting gate-insulator stack. The EOT of an equivalent gate-insulator stack can be reduced by 30% or more compared to an ONO gate-stack and correspondingly lowers the programming voltage levels.

Many options of ONO replacement may be considered for the bottom gate-insulator stack 120, 152, to achieve (a) a lower EOT of the insulator stack, thereby achieving voltage scaling; (b) band engineered asymmetric direct tunneling for electrons and holes to achieve low voltage, low energy high speed carrier transport to the trapping sites and reduce back tunneling of carriers; (c) high density deep energy trapping material to achieve retention and logic window; and (d) high K, large band-gap charge blocking insulator with high barrier energy for electrons and holes, to prevent back injection and charge loss. For (a), (c) and (d) high K insulators are desired to reduce the incident field, thereby improving stack reliability. For high speed carrier transport in the desired direction (item (b)), enhancement of direct tunnel or Fowler-Nordheim tunneling is required. Direct tunneling is enhanced by reducing tunneling distance ("barrier thinning") and by reducing barrier energy while the later enhances Fowler-Nordheim tunneling. Specific examples of which are detailed herein, in the various embodiments of the present invention.

Specifically, in one embodiment, the tunnel insulator layer 118, 158 contains three layers of material, a first layer of 0.5 nm of $SiO_2$ (K=3.9), having a band-gap of approximately 9 eV formed under the channel region 108, 148, which has a band-gap of 1.1 eV. A second layer of 1 nm of SiN (band offset 1.03 eV, K=7) or $Al_2O_3$, (band gap: 8.8 eV, K=10) is formed under the first layer of $SiO_2$. And a third layer of 1 nm of $HfO_2$ (band-gap: 4.5 eV, K=24) is formed under the second layer.

The trapping layer 126, 160 is formed of a layer of 5-7 nm of $TiO_2$ (band-gap of approximately 3.15 eV, K=60) with 3.5-4.0 nm of embedded Cobalt nano-dots, having a resulting EOT of nearly 0.3 nm. Alternatively, the trapping layer could be a single layer of aluminum nitride (AlN, K=15) or nitrogen-rich SiON (of refractive index of approximately $\gamma=1.8$ and K=7) of appropriate thickness containing deep traps (Et>1.0 eV). The charge blocking layer 124, 162 is formed of 10 nm of $Al_2O_3$, (band gap: 8.8 eV, K=10), $Pr_2O_3$ (band gap: 3.9 eV, K=30), $TiO_2$ (band gap: 3.15 eV, K=60) with an EOT as low as 0.67 nm. The back-side gate 166 (in embodiments with separate back-side gates) is then typically formed of polysilicon, tungsten, iridium, or aluminum and may include an initial passivation layer, such as a thin layer of HfN, TaN, TiN, or $IrO_2$ formed under the charge blocking layer 124, 162.

In another embodiment, the tunnel insulator layer 118, 158 also contains three layers of material, a first layer of 0.5 nm of $SiO_2$ (K=4), having a band-gap of approximately 9 eV formed under the channel region 108, which has a band-gap of 1.1 eV. A second layer of 1 nm of SiN (band offset 1.03 eV, K=7) or oxygen-rich silicon oxy-nitride, SiON, (refractive index of approximately $\gamma=1.55$, band-gap 7.3 eV, and K=5) or $Al_2O_3$, (band gap: 8.8 eV, K=10) is formed under the first layer of $SiO_2$. And a third layer of 1.5 nm of $HfO_2$ (band-gap: 4.5 eV, K=24) is formed under the second layer. The effective oxide thickness (EOT) of these three layers could be as low as 1.32 nm. The oxygen-rich silicon oxy-nitride (SiON, with refractive index of approximately $\gamma=1.55$) has an atomic oxygen concentration of >=46%, while its atomic silicon concentration is <=33%. The corresponding nitrogen-rich silicon oxy-nitride (SiON, with a refractive index of approximately $\gamma=1.8$) has an atomic oxygen concentration of <=25%, while the atomic nitrogen concentration is approximately 40%.

The trapping layer 126, 160 is formed of a layer of 6 nm of $HfO_2$ with 3.5-4.0 nm of embedded Cobalt nano-dots, having a resulting EOT of 0.3 nm. The charge blocking layer 124, 162 is formed of 10 nm of $TiO_2$ (K=60) with an EOT of 0.67 nm. And the back-side gate electrode 166 formed of 10 nm of TiN as a passivation layer and doped polysilicon.

It is noted, as detailed above, that multiple insulators can be utilized in embodiments of the present invention, including, but not limited to insulators from the oxide, mixed oxide, nitride, oxynitride, mixed oxynitride, and silicate families.

FIG. 1E details a band-gap diagram 170 of a back-side trap memory cell 100, 140 of FIGS. 1A and 1B in accordance with embodiment of the present invention. In FIG. 1E, the access gate 114, 154 is separated from the body/channel 108, 148 by the access gate insulator layer 116, 156. The trapping layer 126, 160 is separated from the channel 108, 148 by the one or more layers of the asymmetric band-gap tunnel layer 118, 158, and from the back-side gate 166/substrate 102 by the charge blocking layer 124, 162.

Figure 2:
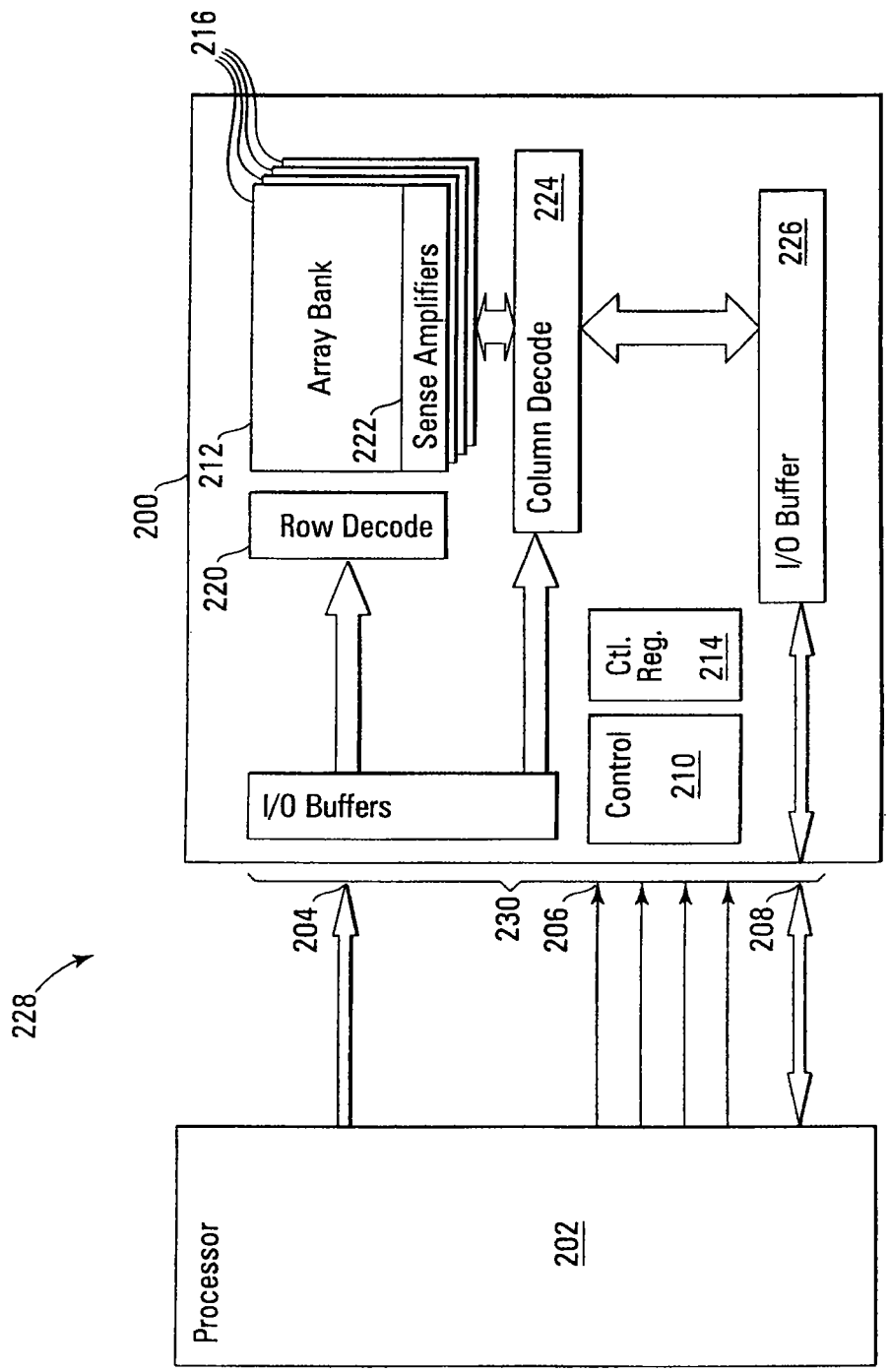
FIG. 2 details a system with a memory device in accordance with embodiments of the present invention.

FIG. 2 shows a simplified diagram of a system 228 incorporating a non-volatile memory device 200 of the present invention coupled to a host 202, which is typically a processing device or memory controller. In one embodiment of the present invention, the non-volatile memory 200 is a NOR architecture Flash memory device or a NAND architecture Flash memory device. The non-volatile memory device 200 has an interface 230 that contains an address interface 204, control interface 206, and data interface 208 that are each coupled to the processing device 202 to allow memory read and write accesses. It is noted that other memory interfaces 230 that can be utilized with embodiments of the present invention exist, such as a combined address/data bus, and will be apparent to those skilled in the art with the benefit of the present disclosure. In one embodiment of the present invention, the interface 230 is a synchronous memory interface, such as a SDRAM or DDR-SDRAM interface. Internal to the non-volatile memory device, an internal memory controller 210 directs the internal operation; managing the non-volatile memory array 212 and updating RAM control registers and non-volatile erase block management registers 214. The RAM control registers and tables 214 are utilized by the internal memory controller 210 during operation of the non-volatile memory device 200. The non-volatile memory array 212 contains a sequence of memory banks or segments 216. Each bank 216 is organized logically into a series of erase blocks (not shown). Memory access addresses are received on the address interface 204 of the non-volatile memory device 200 and divided into a row and column address portions. In one embodiment of the present invention, the non-volatile memory 200 is utilized by the host 202 as a universal or ideal memory, replacing both the RAM and ROM in the system 228.

On a read access the row address is latched and decoded by row decode circuit 220, which selects and activates a row/page (not shown) of memory cells across a selected memory bank. The bit values encoded in the output of the selected row of memory cells are coupled to a local bit line (not shown) and a global bit line (not shown) and are detected by sense amplifiers 222 associated with the memory bank. The column address of the access is latched and decoded by the column decode circuit 224. The output of the column decode circuit 224 selects the desired column data from the internal data bus (not shown) that is coupled to the outputs of the individual read sense amplifiers 222 and couples them to an I/O buffer 226 for transfer from the memory device 200 through the data interface 208.

On a write access the row decode circuit 220 selects the row page and column decode circuit 224 selects write sense amplifiers 222. Data values to be written are coupled from the I/O buffer 226 via the internal data bus to the write sense amplifiers 222 selected by the column decode circuit 224 and written to the selected non-volatile memory cells (not shown) of the memory array 212. The written cells are then reselected by the row and column decode circuits 220, 224 and sense amplifiers 222 so that they can be read to verify that the correct values have been programmed into the selected memory cells.

As previously stated, the two common types of EEPROM and Flash memory array architectures are the "NAND" and "NOR" architectures, so called for the similarity each basic memory cell configuration has to the corresponding logic gate design. In the NOR array architecture, the non-volatile memory cells of the memory array are arranged in a matrix similar to RAM or ROM. The access gates of each non-volatile memory cell of the array matrix are coupled by rows to word select lines (word lines) and their drains are coupled to column bit lines. The source of each non-volatile memory cell is typically coupled to a common source line. The NOR architecture non-volatile memory array is accessed by a row decoder activating a row of non-volatile memory cells by selecting the word line coupled to their access gates. The row of selected memory cells then place their stored data values on the column bit lines by flowing a differing current from the coupled source line to the coupled column bit lines depending on their programmed states. A column page of bit lines is selected and sensed, and individual data words are selected from the sensed data words from the column page and communicated from the memory.

A NAND array architecture also arranges its array of non-volatile memory cells in a matrix such that the access gates of each non-volatile memory cell of the array are coupled by rows to word lines. However each memory cell is not directly coupled to a source line and a column bit line. Instead, the memory cells of the array are arranged together in strings, typically of 8, 16, 32, or more each, where the memory cells in the string are coupled together in series, source to drain, between a common source line and a column bit line. This allows a NAND array architecture to have a higher memory cell density than a comparable NOR array, but with the cost of a generally slower access rate and programming complexity.

A NAND architecture non-volatile memory array is accessed by a row decoder activating a row of non-volatile memory cells by selecting the word select line coupled to their access gates. In addition, the word lines coupled to the access gates of the unselected memory cells of each string are also driven. However, the unselected memory cells of each string are typically driven by a higher access gate voltage so as to operate them as pass transistors and allowing them to pass current in a manner that is unrestricted by their stored data values. Current then flows from the source line to the column bit line through each non-volatile memory cell of the series coupled string, restricted only by the memory cells of each string that are selected to be read. This places the current encoded stored data values of the row of selected memory cells on the column bit lines. A column page of bit lines is selected and sensed, and then individual data words are selected from the sensed data words from the column page and communicated from the memory device.

Figure 3A:
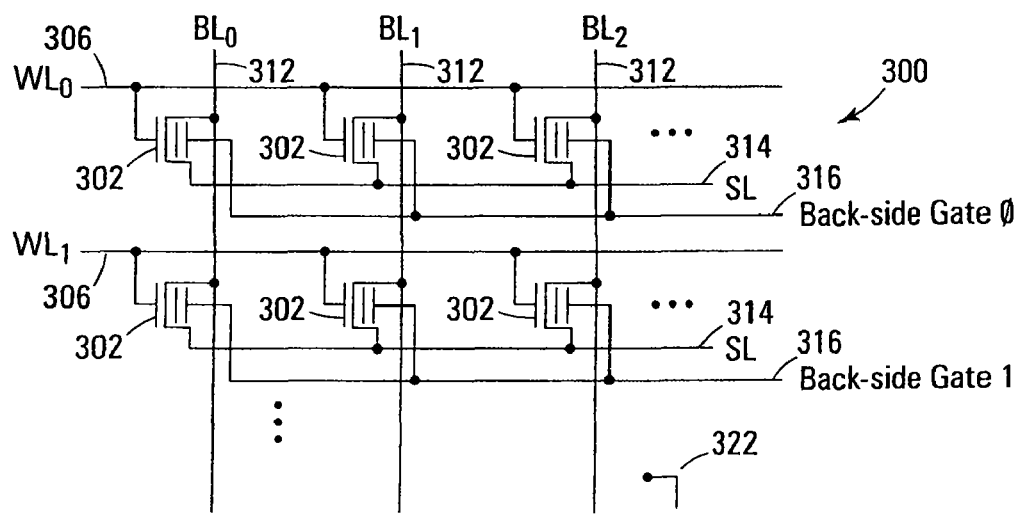
FIGS. 3A and 3B detail NOR and NAND architecture memory arrays in accordance with embodiments of the present invention.

FIG. 3A shows a simplified NOR back-side trap floating node/trapping layer memory array 300 of a EEPROM or Flash memory device of an embodiment of the present invention. In FIG. 3A, a NOR array 300 couples back-side trap memory cells 302 of embodiments of the present invention to bit lines 312, source lines 314, word lines 306, and a substrate connection 322. In forming the NOR array 300, the bit lines 312 and source lines 314 are typically formed locally from N+ doped regions deposited in the substrate and are separated by a channel region. Each memory cell FET 302 has a top gate-insulator stack formed over the channel region and a bottom gate-insulator stack formed under the channel region and between the N+ doped regions of a bit line 312 and a source line 314, utilizing the N+ doped regions as a drain and source respectively (it is noted that the source line 314 may be replaced with a second bit line 312 connection in multi-bit cell arrays, so that the current flow through the memory cell may be reversed). As described above, the bottom gate-insulator stack is made of an asymmetric band-gap tunnel insulator layer having one or more layers formed beneath the channel region, a floating node/trapping layer formed under the tunnel insulator, charge blocking insulator layer formed under the trapping layer, and a back-side gate formed under the charge blocking insulator. It is noted that in another embodiment of the present invention, the substrate takes the place and function of the back-side gate, which is then not individually formed. The top gate-insulator stack is made of an insulator layer formed on top of the channel region and an access gate 306 (typically formed integral to the word line 306, also known as a control gate line) formed over the insulator. In FIG. 3A, back-side gate control lines 316 are shown coupled to the back-side gates of each row, allowing the memory cells of the row to be programmed and erased. It is noted that, instead of individual back-side gate control lines 316, the substrate connection 322 can be utilized to apply programming and erase voltages to the back-side gate, in particular, where the back-side gate is formed by the substrate. To further enable this mode of operation, in one embodiment of the present invention, each row of memory is formed in isolation trenches, allowing the substrate of each isolation trench to be individually biased. It is also noted that other NOR architecture memory array 300 configurations incorporating embodiments of the present invention are possible and will be apparent to those skilled in the art with the benefit of the present disclosure.

Figure 3B:
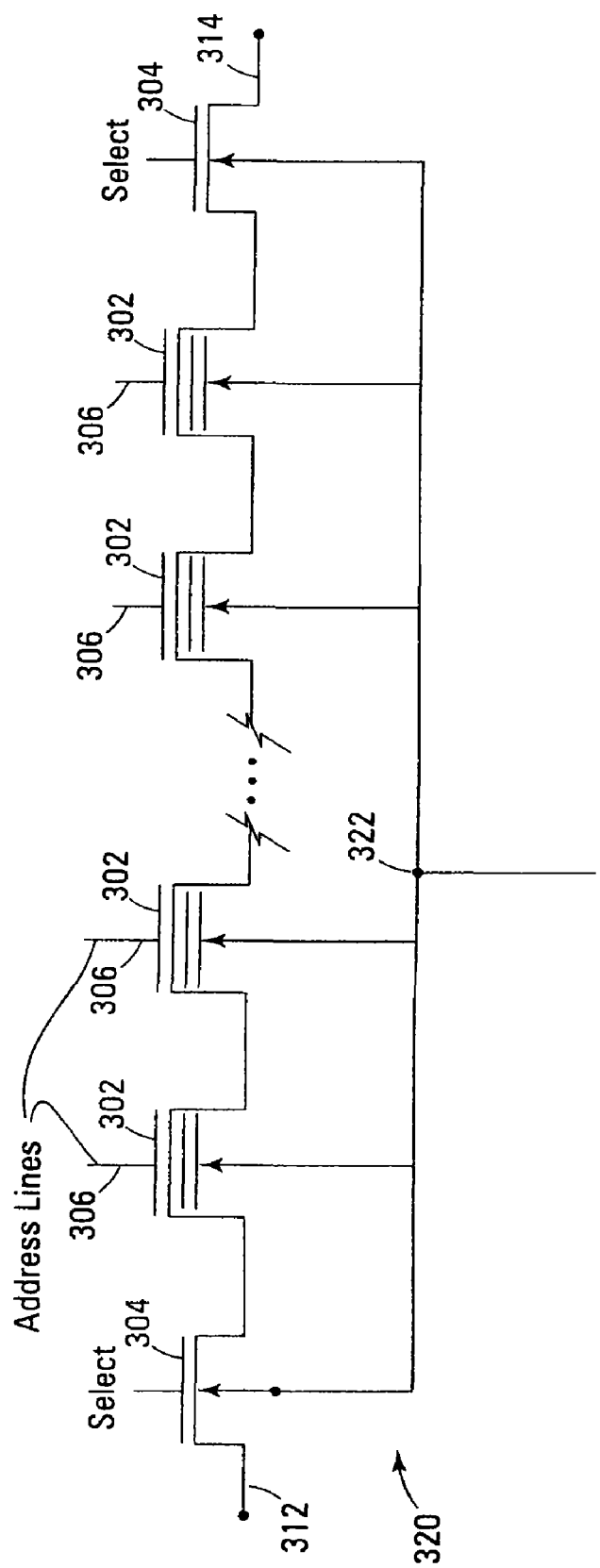

FIG. 3B details a simplified NAND memory string 320 of a NAND architecture EEPROM or Flash memory device of an embodiment of the present invention. In FIG. 3B, a series of back-side trap memory cells 302 of embodiments of the present invention are coupled together source to drain to form a NAND string 320 (typically of 8, 16, 32, or more cells). Each memory cell FET 302 has a top gate-insulator stack formed over the channel region and a bottom gate-insulator stack formed under the channel region. N+ doped regions are formed between each gate insulator stack to form the source and drain regions of the adjacent floating node memory cells, which additionally operate as connectors to couple the cells of the NAND string 320 together. Optional select gates 304, that are coupled to gate select lines, are formed at either end of the NAND floating node string 320 and selectively couple opposite ends of the NAND floating node string 320 to a bit line 312 and a source line 314. In a NAND memory array, the NAND architecture memory string 320 of FIG. 3B would be coupled to bit lines 312, source lines 314, word lines 306, and a substrate connection 322. As described above, the bottom gate-insulator stack is made of an asymmetric band-gap tunnel insulator layer having one or more layers formed beneath the channel region, a floating node/trapping layer formed under the tunnel insulator, charge blocking insulator layer formed under the trapping layer on top of the substrate, which takes the place and function of the back-side gate. To further enable this mode of operation, in one embodiment of the present invention, each NAND architecture memory string 320 of memory is formed in an isolation trench, allowing the substrate of each isolation trench to be individually biased for programming and erasure. It is noted that in another embodiment of the present invention, an individual back-side gate can be formed under the charge blocking insulator and coupled to a back-side gate control line. The top gate-insulator stack is made of an insulator layer formed on top of the channel region and an access gate 306 (typically formed integral to the word line 306, also known as a control gate line) formed over the insulator. In FIG. 3B, the substrate connection 322 is shown coupled to the back-side gates of each NAND string 320, allowing the memory cells of each NAND string 320 to be programmed and erased. It is noted that, as described above, instead of utilizing the substrate connection 322, individual back-side gate control lines can be formed and utilized to apply programming and erase voltages to a formed back-side gate.

It is also noted that other memory cells, memory strings, arrays, and memory devices in accordance with embodiments of the present invention are possible and should be apparent to those skilled in the art with benefit of the present disclosure.

CONCLUSION

Non-volatile memory devices and arrays have been described that utilize back-side trapped floating node memory cells with band-gap engineered back-side gate-insulator stacks with asymmetric tunnel barriers. Embodiments of the present invention allow for direct tunnel programming and efficient erase with electrons and holes, while maintaining high charge blocking barriers and deep carrier trapping sites for good charge retention and reduces the possibility of damage to the channel/insulator interface by separating sensing from programming via a front side FET element of the memory device. The direct tunneling program and efficient erase capability reduces damage to the back-side gate stack and enhances device endurance and reliability. Back-side trap memory cells also enable scaling of feature size due to voltage scalability and elimination of short channel effect via a thin body channel device. Memory device embodiments of the present invention are presented that are arranged in NOR or NAND memory architecture arrays. Memory cell embodiments of the present invention also allow multiple levels of bit storage in a single memory cell, and allow for programming and erase with reduced voltages.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of forming a back-side trap non-volatile memory cell, comprising:
    forming a trapping material wherein the trapping material has a conduction band offset;
    forming two or more sub-layers of dielectric material on the trapping material, wherein each sub-layer of dielectric material has a conduction band offset and wherein the conduction band offset of each sub-layer of dielectric material is less than the conduction band offset of the material upon which it is formed; and
    forming a channel region on the two or more sub-layers of dielectric material.

2. The method of claim 1, further comprising forming a first and a second source/drain region coupled by the channel region, forming a charge blocking material beneath the trapping material, and forming a back-side gate beneath the charge blocking material.

3. A method of forming a back-side trap non-volatile memory cell, comprising:
    forming a trapping material wherein the trapping material has a conduction band offset;
    forming two or more sub-layers of dielectric material on the trapping material, wherein each sub-layer of dielectric material has a conduction band offset and wherein the conduction band offset of each sub-layer of dielectric material is less than the conduction band offset of the material upon which it is formed; and
    forming a channel region on the two or more sub-layers of dielectric material;
    wherein forming two or more sub-layers of dielectric material further comprises forming a first sub-layer on the trapping material and forming a second sub-layer on the first sub-layer wherein the first sub-layer conduction band offset is greater than the second sub-layer conduction band offset.

4. The method of claim 3, wherein forming two or more sub-layers of dielectric material further comprises forming a third sub-layer directly on the second sub-layer wherein the second sub-layer conduction band offset e is greater than the third sub-layer band-gap value.

5. The method of claim 1, wherein each of the two or more sub-layers is selected from a group of materials consisting of oxides, mixed oxides, nitrides, oxynitrides, mixed oxynitrides.

6. A method of forming a back-side trap non-volatile memory cell structure, comprising:
forming a first and second source/drain regions on a substrate, the first and second source/drain regions defining an intervening channel region;
forming a bottom gate-stack, the bottom gate-stack comprising,
forming a charge blocking layer over the substrate,
forming a trapping layer over the charge blocking layer, the trapping layer having a conduction band offset, and
forming a tunnel insulator layer of two or more sub-layers over the trapping layer and beneath the channel region, wherein each sub-layer of the tunnel insulator layer has a conduction band offset and wherein the conduction band offset of each sub-layer of the tunnel insulator layer is less than the conduction band offset of the material upon which it is formed; and
forming a top gate-stack, the top gate-stack comprising,
forming an access gate insulator layer over the channel region, and
forming an access gate over the access gate insulator layer.

7. The method of claim 6, wherein forming a tunnel insulator layer and forming a trapping layer further comprises forming a tunnel insulator layer of a layer of oxygen-rich SiON (refractive index of approximately 1.5) and forming a trapping layer of nitrogen-rich SiON (refractive index of approximately 1.8).

8. The method of claim 6, wherein forming a tunnel insulator layer of two or more sub-layers further comprises, forming two or more sub-layers of dielectric material of increasing conduction band offset, wherein each of the two or more sub-layers of dielectric material are selected from one of an oxide, a mixed oxide, a nitride, a oxynitride, a mixed oxynitride, and a silicate.

9. The method of claim 8, wherein forming a tunnel insulator layer of two or more sub-layers further comprises, forming two sub-layers, where a first and second sub-layers are one of $SiO_2$ and $Pr_2O_3$, $SiO_2$ and $TiO_2$, and $SiO_2$ and $HfO_2$.

10. The method of claim 6, wherein forming a tunnel insulator layer of two or more sub-layers further comprises, forming three sub-layers, where a first, second, and third sub-layers are one of $SiO_2$, SiN, and $HfO_2$; $SiO_2$, $HfO_2$, and $Pr_2O_3$; and $SiO_2$, $HfO_2$, and $TiO_2$.

11. The method of claim 6, wherein forming a trapping layer further comprises forming one of a floating gate, a floating node, and an embedded trapping layer.

12. The method of claim 11, wherein forming a trapping layer further comprises forming charge trapping deep potential wells.

13. The method of claim 11, wherein forming a trapping layer further comprises forming a trapping layer of one of oxygen-rich silicon oxy-nitride (SiON), nitrogen-rich silicon oxy-nitride (SiON), aluminum nitride (AlN), silicon nitride (SiN), silicon-rich nitride (SRN), hafnium oxide ($HfO_2$), tantalum oxide ($Ta_2O_5$), and titanium oxide ($TiO_2$).

14. The method of claim 6, wherein forming a charge blocking layer further comprises forming a charge blocking layer of one or more sub-layers of high K dielectric.

15. The method of claim 14, wherein forming a charge blocking layer of one or more sub-layers of high K dielectric further comprises forming the one or more sub-layers from an insulator from one of oxide, mixed oxide, nitride, oxynitride, mixed oxynitride, and silicate families.

16. The method of claim 15, wherein forming a charge blocking layer of one or more sub-layers of high K dielectric further comprises forming the one or more sub-layers of one of hafnium oxide ($HfO_2$), alumina ($Al_2O_3$), praseodymium oxide ($Pr_2O_3$), and titanium oxide ($TiO_2$).

17. The method of claim 6, further comprising forming a N- or P-doped channel region.

18. The method of claim 6, wherein forming a charge blocking layer over the substrate further comprises forming a charge blocking layer over a back-side gate.

19. A method of operating a back-side trap non-volatile memory cell, comprising:
programming the back-side trap non-volatile memory cell via direct tunneling of carriers through a tunnel insulator layer, wherein the tunnel insulator layer is an asymmetric band-gap tunnel insulator layer having two or more sub-layers formed beneath a channel region of the back-side trap non-volatile memory cell, wherein the two or more sub-layers comprise layers of material of increasing conduction band offset; and
trapping the carriers in a trapping layer formed under the tunnel insulator layer.

20. The method of claim 19, wherein trapping the carriers in a trapping layer formed under the tunnel insulator layer further comprises trapping the charge localized proximate to a source/drain region of the back-side trap non-volatile memory cell for multiple bit storage.

21. The method of claim 19, further comprising erasing the back-side trap non-volatile memory cell by removing the carriers trapped on the trapping layer via one of direct tunneling, Fowler-Nordheim tunneling, channel hot electron (CHE) injection, and hot hole injection from the channel region.

22. The method of claim 19, further comprising erasing the back-side trap non-volatile memory cell by removing the carriers trapped on the trapping layer via transporting carriers to or from the trapping layer through a charge blocking layer formed under the trapping layer.

* * * * *

UNITED STATES PATENT AND TRADEMARK OFFICE
CERTIFICATE OF CORRECTION

PATENT NO.       : 8,058,118 B2
APPLICATION NO.  : 12/956570
DATED            : November 15, 2011
INVENTOR(S)      : Arup Bhattacharyya It is certified that error appears in the above-identified patent and that said Letters Patent is hereby corrected as shown below:

In column 19, line 1, in Claim 4, after "band offset" delete "e".

Signed and Sealed this
Tenth Day of January, 2012

David J. Kappos
*Director of the United States Patent and Trademark Office*